United States Patent [19]

Hatcher

[11] Patent Number: 4,487,653
[45] Date of Patent: Dec. 11, 1984

[54] PROCESS FOR FORMING AND LOCATING BURIED LAYERS

[75] Inventor: Owen W. Hatcher, Sunnyvale, Calif.

[73] Assignee: Advanced Micro Devices, Inc., Sunnyvale, Calif.

[21] Appl. No.: 590,678

[22] Filed: Mar. 19, 1984

[51] Int. Cl.³ ............... B44C 1/22; C03C 15/00; B05D 5/12; H01L 7/36
[52] U.S. Cl. .................... 156/644; 29/580; 148/175; 148/187; 156/651; 156/653; 156/657; 156/662; 156/661.1; 427/85; 427/86; 430/313
[58] Field of Search ............. 29/576 W, 580; 427/86, 427/85; 430/313; 156/644, 648, 651, 653, 657, 659.1, 661.1, 662; 148/1.5, 187, 175

[56] References Cited

U.S. PATENT DOCUMENTS

| | | | |
|---|---|---|---|
| 4,125,418 | 11/1978 | Vinton | 156/657 X |
| 4,233,091 | 11/1980 | Kawabe | 156/657 X |
| 4,251,300 | 2/1981 | Caldwell | 156/657 X |
| 4,309,813 | 1/1982 | Hull | 156/657 X |

Primary Examiner—William A. Powell
Attorney, Agent, or Firm—Patrick T. King

[57] ABSTRACT

A method for forming vertically spaced apart regions on an integrated circuit substrate is disclosed. One or more recesses are formed in inactive regions of the substrate, while the remaining surface of the substrate remains substantially flat. When an epitaxial layer is deposited over the substrate, the recesses in the substrate causes the formation of corresponding recesses in the exposed surface of the epitaxial layer. Such recesses are useful as alignment marks in properly locating the masks used in defining active regions on the surface of the epitaxial layer.

7 Claims, 9 Drawing Figures

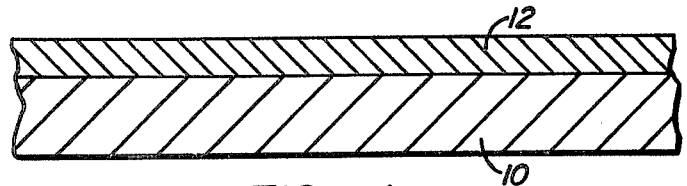
FIG.—1.
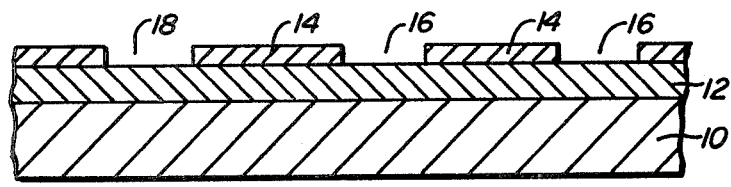
FIG.—2.
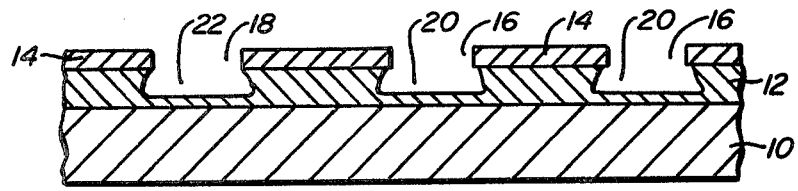
FIG.—3.
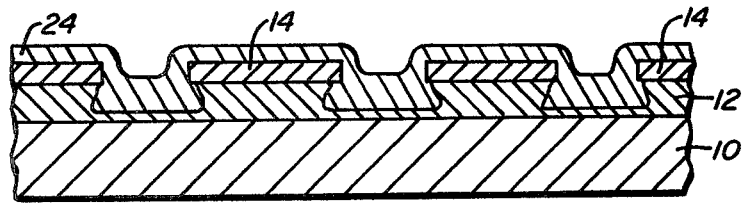
FIG.—4.

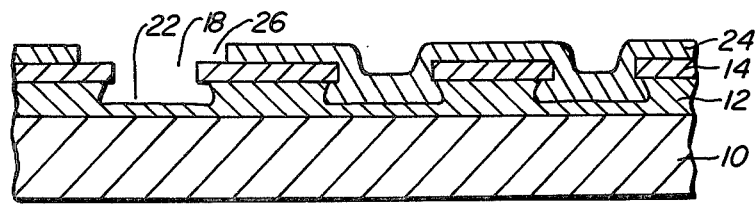
FIG._5.
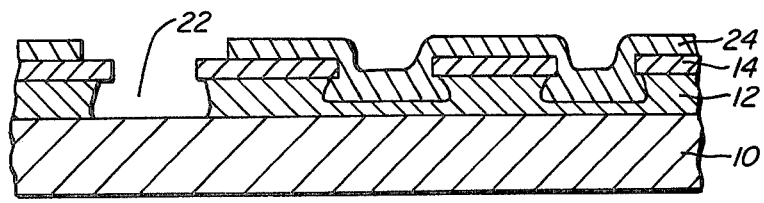
FIG._6.
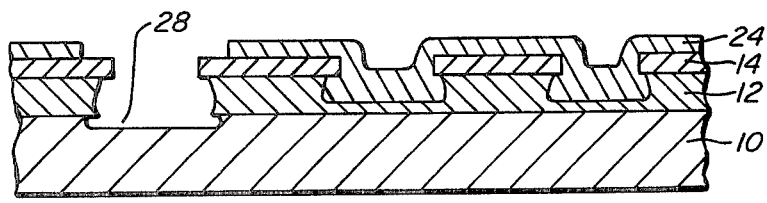
FIG._7.
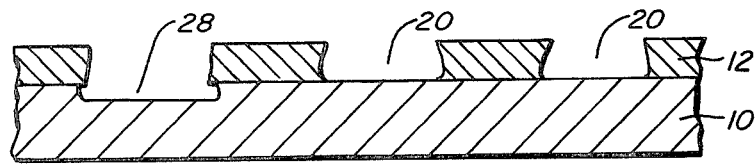
FIG._8.
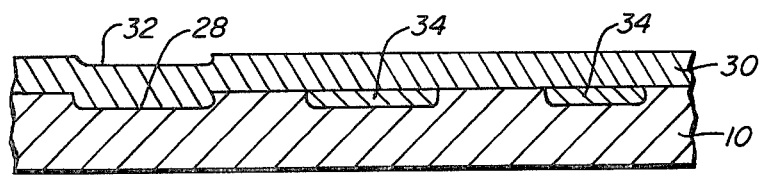
FIG._9.

PROCESS FOR FORMING AND LOCATING BURIED LAYERS

BACKGROUND OF THE INVENTION

1. Field of the Invention

The present invention relates generally to semiconductor fabrication, and more particularly to a method for forming and locating a doped region, referred to as a buried layer, under an overlying epitaxial layer.

2. Description of the Prior Art

Integrated circuits are fabricated by forming a large number of discrete devices on the surface of a silicon wafer, referred to as the substrate. Such devices are defined by alternating regions of P-doped and N-doped silicon, usually arranged vertically on the substrate. In a typical bipolar fabrication process, an NPN transistor may be formed by doping an N+ region in a P− substrate. After forming an overlying N-type epitaxial layer, additional P-type and N+-type regions are formed above the N+ region initially formed in the substrate.

Although a seemingly limitless number of configurations exist for forming discrete devices, the above example illustrates a common problem encountered in the fabrication of integrated circuits. After the initial N+ region was formed in the substrate, it was covered by the epitaxial layer. Since the P-type and N+-type regions in the epitaxial layer should be vertically aligned with the "buried" N+ region in the substrate, it is necessary to provide some means for properly locating the masks used for forming the overlying regions. One common approach has been to mark the location of a particular buried region by oxidizing the region to form a recess or indentation. The indentation formed in the substrate will be visible in the epitaxial layer and allows proper alignment of the masks which are used to define doped regions therein.

Although generally functional, the above-described technique for locating the buried regions and aligning the masks, suffers from certain drawbacks. In particular, the uneven surface of the substrate which results from the formation of such indentations interferes with subsequent fabrication steps. For example, natural pattern shift (translation of the indentation) necessitates that components be formed on uneven surfaces (if the area required to construct the component is minimum consistent with other requirements, e.g., breakdown). Transistors formed with active areas overlying the recessed regions will have less than optimum gain characteristics. Component matching will be less than optimum when one component overlies a recess and the other does not. As a final example, forming metallization layers becomes more difficult and breakage of metal interconnect lines becomes more common. The problem is exacerbated as the density of the integrated circuit increases. As devices are formed at increasing density, the maximum line width that can be utilized decreases correspondingly. Such thin interconnect lines are very fragile and particularly susceptible to breakage and failure.

The present invention provides a method for marking the surface of a semiconductor substrate without the need of forming indentations in the active regions of the substrate. By providing a substantially flat surface upon which subsequent layers are deposited, the problems experienced by the prior art which result from an uneven surface on the semiconductor substrate can be avoided. In particular, the problems encountered in forming fragile metallization layers can be reduced or eliminated.

SUMMARY OF THE INVENTION

The present invention provides a method for forming vertically spaced-apart regions on an integrated circuit substrate. In particular, the method allows the proper horizontal alignment of a photoresist mask with regions on the substrate which are buried beneath an intermediate layer. The method relies on forming an alignment mark on an inactive region of the substrate, usually by etching the substrate to define a visible recess. Formation of the active regions on the substrate is then performed using techniques which do not affect the surface profile. Thus, as subsequent layers are formed over the substrate, e.g., the epitaxial layer, the resulting surfaces are substantially flat, with the exception of recesses or depressions which correspond to the alignment marks initially formed in the substrate. These alignment marks may then be used to properly locate the photoresist masks used in forming the active regions, particularly on the epitaxial layer.

The alignment marks may be formed by employing conventional semiconductor processing techniques in a novel manner. Prior to forming the doped or active regions on the substrate, a silicon dioxide masking layer is formed. The masking layer is then etched in a predetermined pattern which includes one or more alignment mark holes formed over inactive regions of the substrate, as well as the holes corresponding to the desired pattern of doped regions. Before exposing the underlying substrate, however, the silicon dioxide etch is stopped and a photoresist layer deposited over the masking layer to cover the partially completed pattern. The photoresist layer is then exposed and developed at the alignment mark holes only. The remaining silicon dioxide in the alignment holes is then removed and the underlying substrate etched to form a recess in the substrate. The photoresist can then be removed and the remainder of the substrate processed to form the desired doped regions.

BRIEF DESCRIPTION OF THE DRAWINGS

FIGS. 1-9 illustrate the processing steps for forming the alignment mark in a substrate in accordance with the present invention.

DESCRIPTION OF THE PREFERRED EMBODIMENT

The present invention finds particular use during the initial stages of semiconductor fabrication when active regions are being formed in the silicon substrate and overlying epitaxial layer. Such active regions include transistors, diodes, resistors, and the like, which are arranged in a predetermined array on the surface of the integrated circuit. The arrays are three-dimensional, and it is usually necessary to align various doped or active regions on the substrate with corresponding regions in the overlying epitaxial layer. The present invention allows for such alignment by providing a visible recess on the substrate, while leaving the remainder of the substrate surface substantially flat, as will now be described.

The process of the present invention begins with a conventional silicon wafer 10 which defines a silicon substrate for the integrated circuit being fabricated. A silicon dioxide layer 12 is formed over the substrate 10, typically by thermal oxidation of the substrate in an oxidizing atmosphere at an elevated temperature. The thickness of the silicon dioxide layer is not critical, typically being in the range from about 8,000 to 16,000 angstroms. Alternatively, the silicon dioxide layer can be formed by chemical vapor deposition (CVD). Both methods are well known in the art and need not be described further.

A photoresist layer 14 (FIG. 2) is then coated over the silicon dioxide layer 12 in a conventional manner. Typically, a primer such as hexamethyldisilizane is applied to the surface to promote adhesion of the photoresist to the oxide. The photoresist is applied to the oxide layer 12 as a liquid and spun to an even thickness, typically in the range from 5,000 to 10,000 angstroms. After coating, the wafers are softbaked prior to imaging.

Imaging is performed in a conventional manner to define a predetermined pattern in the photoresist layer 14. The pattern will include openings 16 which correspond to regions on the substrate 10 which will be doped to form the active regions of the integrated circuit. The pattern will also include one or more holes 18 which will be used to define alignment marks in the substrate, as will be described in detail hereinafter. The layer 14 is exposed to a radiation source through a mask, and developed.

Referring now to FIG. 3, the silicon dioxide layer 12 is etched in a conventional manner, typically using buffered hydrofluoric acid or plasma etching techniques. The etching step is performed for a time selected to remove about 60% to 80%, usually about 70%, of the thickness of the oxide layer 12. It is important that the etch be stopped prior to removal of the oxide to the silicon interface particularly if a liquid etchant is used to form the alignment mark, as described below. The remaining silicon dioxide will protect the silicon under holes 20 should the photoresist break down during the silicon etch. After etching, the wafer will appear as illustrated in FIG. 3. Holes 20 have been formed in the oxide corresponding to the holes 16 in the photoresist layer 14, while similar holes 22 have been formed in the oxide corresponding to the alignment holes 18.

As shown in FIG. 4, a second photoresist layer 24 is then applied onto the wafer. The photoresist covers the entire surface of the wafer and fills in the holes 20 and 22 formed in the previous etching step. In this way, the holes 20, which will define the active, doped regions on the substrate 10, are protected during formation of the alignment mark as will now be described.

To form the alignment mark, photoresist layer 24 is exposed through mask which exposes only the alignment mark(s) and results in the removal of photoresist from the alignment mark hole 22 after development. Typically, the alignment mark mask will be oversized in that the hole 26 formed in the second photoresist layer 24 is larger than the hole 18 formed in the first photoresist layer 14. The oversized hole 26 helps insure that the photoresist is completely removed from the alignment mark hole 22.

Turning now to FIG. 6, the remaining silicon dioxide in the alignment mark hole 22 is removed by a conventional silicon dioxide etch. Such etching may be accomplished, as described previously, by buffered hydrofluoric acid or by a plasma etch.

After the silicon dioxide is removed to the silicon interface, it is necessary to perform a silicon etch to define a recess 28 in the substrate 10. The recess 28 defines the alignment mark which is used in subsequent processing steps for aligning the formation of active regions in an overlying epitaxial layer. The recess may be formed using any conventional silicon etchant, such as a buffered solution of hydrofluoric and nitric acids, or by plasma etch.

Depth of the recess formed is not critical. It is necessary only that a sufficient step be created to form a visible recess in the epitaxial layer after it is deposited. Usually, the recess 28 will have a depth in the range from about 1,000 to 4,000 angstroms, with horizontal dimensions in the range from about 10 to 25 microns.

After formation of the recess 28, the wafer will be processed to form the desired active regions in holes 20. The photoresist which remains after the silicon etch will be removed from the wafer using a conventional solvent, and the remaining silicon dioxide in the holes 20 is removed using a conventional oxide etchant. After the silicon interface is exposed in holes 20 (as illustrated in FIG. 8) the silicon substrate can be doped with impurities by solid state diffusion under mildly oxidizing conditions (e.g., 99% $N_2$–1% $O_2$) in order to prevent oxidation of the silicon surface. Such oxidation would disturb the substantially flat surface on the substrate 10 which is desired for subsequent processing. Alternatively, the dopants may be introduced by ion implantation under non-oxidizing conditions.

After the desired doped regions are formed on the substrate 10, the silicon dioxide layer 12 will be removed and an epitaxial layer deposited by conventional techniques. The epitaxial layer 30 will have a substantially flat surface with the exception of recesses 32 which form as a result of the underlying recess 28 in the substrate 10. In particular, the regions of the epitaxial layer 30 which overlie the doped regions 34 in the substrate 10 are substantially flat. Alignment of the masks used for forming active regions in the epitaxial layer 30 is accomplished by reference to the recess 32.

Although the foregoing invention has been described in some detail by way of illustration and example for purposes of clarity of understanding, it will be obvious that certain changes and modifications may be practiced within the scope of the appended claims.

What is claimed is:

1. A method for marking an integrated circuit to facilitate mask alignment, said method comprising the following steps:

(a) forming a silicon dioxide layer on the substrate;

(b) etching a predetermined pattern in said silicon dioxide layer, said pattern including one or more alignment mark holes formed over inactive regions of the substrate;

(c) stopping the etch of step (b) prior to exposing the underlying substrate;

(d) depositing a photoresist layer over the silicon dioxide layer to fill in the pattern formed in step (b);

(e) exposing and developing the photoresist layer to remove photoresist from the alignment mark holes only; and (f) etching the substrate to remove the remaining silicon dioxide from the alignment mark hole and to further form a recess in the substrate, whereby the recess may be used for alignment of active regions in subsequently deposited layers while the remainder of the substrate surface is substantially flat.

2. A method as in claim 1, wherein the pattern in step (b) is etched by depositing a layer of photoresist on the silicon dioxide layer, exposing and developing the photoresist in the predetermined pattern, and etching with buffered hydrofluoric acid.

3. A method as in claim 1, wherein the etching of step (b) is stopped after about 70% of the silicon dioxide has been removed.

4. A method as in claim 1, wherein the remaining silicon dioxide is removed by buffered hydrofluoric acid etching, and the recess is formed in the substrate by either a buffered solution of hydrofluoric and nitric acids or by plasma etching.

5. A method for forming vertically spaced apart regions on an integrated circuit substrate, said method comprising the following steps:
 (a) forming a recess in an inactive region of the substrate, said recess defining an alignment mark;
 (b) forming an array of doped regions located in a predefined pattern relative to the alignment mark, wherein steps (a) and (b) are performed in a predetermined order under conditions which leave the surface of the substrate other than the alignment mark substantially flat;
 (c) depositing an epitaxial layer over the substrate whereby the surface of the epitaxial layer is substantially flat except for the alignment mark; and
 (d) forming an array of doped regions on the epitaxial layer, where the location of the array is determined by reference to the alignment mark.

6. A method as in claim 5, wherein the recess is formed by depositing a silicon dioxide layer over the substrate, etching a hole in the silicon dioxide layer at the desired location of the alignment mark and thereafter etching the recess in the hole through the silicon dioxide layer.

7. A method as in claim 6, wherein the silicon dioxide layer is patterned to define the array of doped regions on the substrate simultaneously with the alignment mark.

* * * * *